(12) United States Patent
Han (10) Patent No.: US 7,220,623 B2
(45) Date of Patent: May 22, 2007

(54) METHOD FOR MANUFACTURING SILICIDE AND SEMICONDUCTOR WITH THE SILICIDE

(75) Inventor: Jae-Won Han, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/751,172

(22) Filed: Dec. 30, 2003

(65) Prior Publication Data

US 2004/0201066 A1 Oct. 14, 2004

(30) Foreign Application Priority Data

Apr. 8, 2003 (KR) .................. 10-2003-0021958

(51) Int. Cl.
*H01L 21/44* (2006.01)

(52) U.S. Cl. .................. 438/123; 438/586; 438/597; 438/630; 438/649; 438/655; 438/658; 438/660; 438/664; 438/682; 257/E21.165; 257/E21.438

(58) Field of Classification Search ........ 438/682–683, 438/710, 745, 749; 134/1–1.3
See application file for complete search history.

(56) References Cited

U.S. PATENT DOCUMENTS

| | | | |
|---|---|---|---|
| 4,908,331 A * | 3/1990 | Raaijmakers | ............ 438/682 |
| 5,221,853 A | 6/1993 | Joshi et al. | |
| 5,275,963 A * | 1/1994 | Cederbaum et al. | ........ 438/624 |
| 5,780,350 A | 7/1998 | Kapoor | |
| 5,780,362 A * | 7/1998 | Wang et al. | ............ 438/683 |
| 5,869,397 A | 2/1999 | Miyakawa | |

(Continued)

FOREIGN PATENT DOCUMENTS

JP 10-229052 8/1998

OTHER PUBLICATIONS

Akira Inoue; Manufacture of Semiconductor Device; Patent Abstracts of Japan; Apr. 23, 1999; Publication No. 11111642 A; Japanese Patent Office; Japan.
Office Action dated May 21, 2005; Korean Patent Application No. 10-2003-0021958, in korean.

(Continued)

*Primary Examiner*—Michael Lebentritt
*Assistant Examiner*—Kyoung Lee
(74) *Attorney, Agent, or Firm*—Andrew D. Fortney (57) ABSTRACT

The present invention is directed to a method of manufacturing silicide used to reduce a contact resistance at a contact of a semiconductor device and a semiconductor device with the silicide manufactured by the same method. The method comprises the steps of: (a) cleaning a semiconductor substrate with a transistor formed thereon, the transistor including a source electrode, a drain electrode and a gate electrode; (b) placing the cleaned semiconductor substrate into a sputter chamber in a deposition equipment, and forming silicide at the same time of depositing a metal film under a state where the semiconductor substrate is heated at a temperature of 450-600° C.; (c) removing residual metal film not used for the formation of silicide; and (d) annealing the semiconductor substrate. According to the present invention, since silicide is formed at the same time of depositing a cobalt film, there is an advantage of omission of a protection film formation process over the prior arts where silicide is formed by a post-heat treatment.

20 Claims, 6 Drawing Sheets

U.S. PATENT DOCUMENTS

| | | | |
|---|---|---|---|
| 6,013,566 A | | 1/2000 | Thakur et al. |
| 6,022,805 A | * | 2/2000 | Sumi .......................... 438/677 |
| 6,136,699 A | | 10/2000 | Inoue |
| 6,316,362 B1 | | 11/2001 | Inoue |
| 6,337,272 B1 | * | 1/2002 | Hamanaka .................. 438/651 |
| 6,458,711 B1 | * | 10/2002 | O'Brien et al. ............. 438/745 |
| 6,534,390 B1 | | 3/2003 | Chong et al. |
| 6,725,119 B1 | * | 4/2004 | Wake ......................... 700/121 |
| 2003/0148606 A1 | * | 8/2003 | Fortin et al. ................. 438/655 |

OTHER PUBLICATIONS

Hiromi Abe, Masayasu Suzuki and Shinachi Ishida; Semiconductor Integrated Circuit Device and Manufacture Thereof; Patent Abstracts of Japan; JP 10-229052; Aug. 25, 1998; 14 Pages; Japan Patent Office.

S. M. Rossnagel; Sputter Deposition for Semiconductor Manufacturing; IBM Journal of Research and Development; Jan.-Mar. 1999; 11 Pages.

* cited by examiner

METHOD FOR MANUFACTURING SILICIDE AND SEMICONDUCTOR WITH THE SILICIDE

BACKGROUND OF THE INVENTION (a) Field of the Invention

The present invention relates to a semiconductor device and a method of manufacturing the same, and more particularly to a method of manufacturing silicide used to reduce a contact resistance at a contact of a semiconductor device and a semiconductor device with the silicide manufactured by the same method.

(b) Description of the Related Art

In general, a semiconductor device includes a plurality of transistors, each of which includes a source/drain electrode and a gate electrode in each of device regions separated from one another by a device isolation method such as a LOCOS (local oxidation of silicon) or STI (shallow trench isolation) method, and titanium silicide or cobalt silicide used to reduce a contact resistance of a transistor driving circuit.

Techniques related to the silicide formation process are disclosed in U.S. Pat. Nos. 6,534,390, 6,316,362, 6,013,566, 5,869,397, and 5,780,350

Hereinafter, a method of manufacturing the silicide according to the prior art is in brief described with reference to FIG. 3 as follows.

Figure 3A:
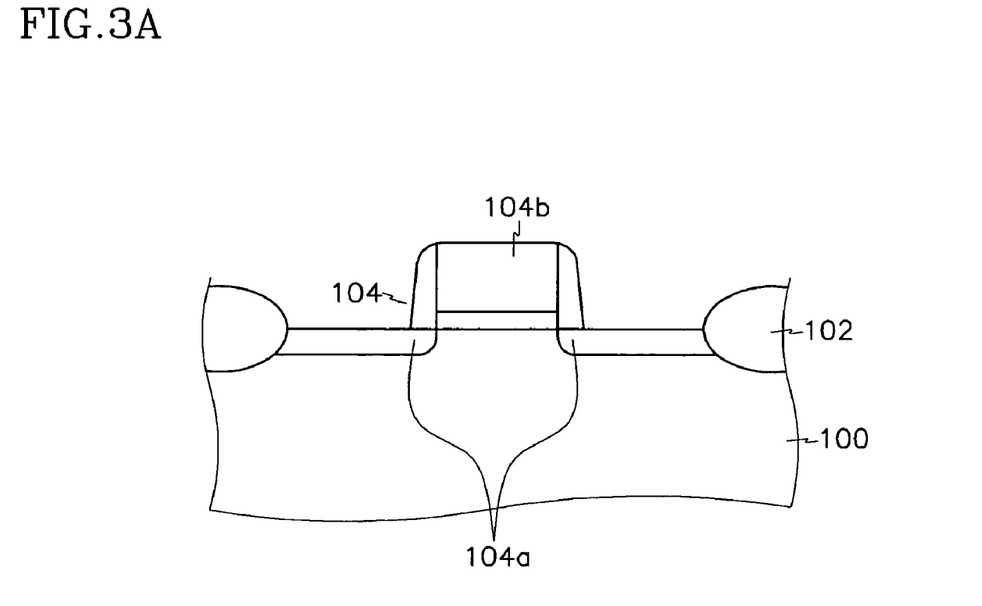
FIGS. 3A to 3D are views showing a process for silicide according to the prior art.

First, as shown in FIG. 3A, a transistor 104 including a source/drain electrode 104a and a gate electrode 104b is formed between two device isolation regions 102 of a semiconductor substrate 100, and then a cleaning process for removing a variety of undesired impurities such as metal impurities, organic contaminations or natural oxide films residual on the semiconductor substrate 100 is performed.

Here, a chemical cleaning process to use SC1 (standard cleaning: an organic mixture where $NH_4OH:H_2O_2:H_2O$ is 1:4:20) solution and HF or DHF (dilute HF) solution is used as the cleaning process.

Figure 3B:
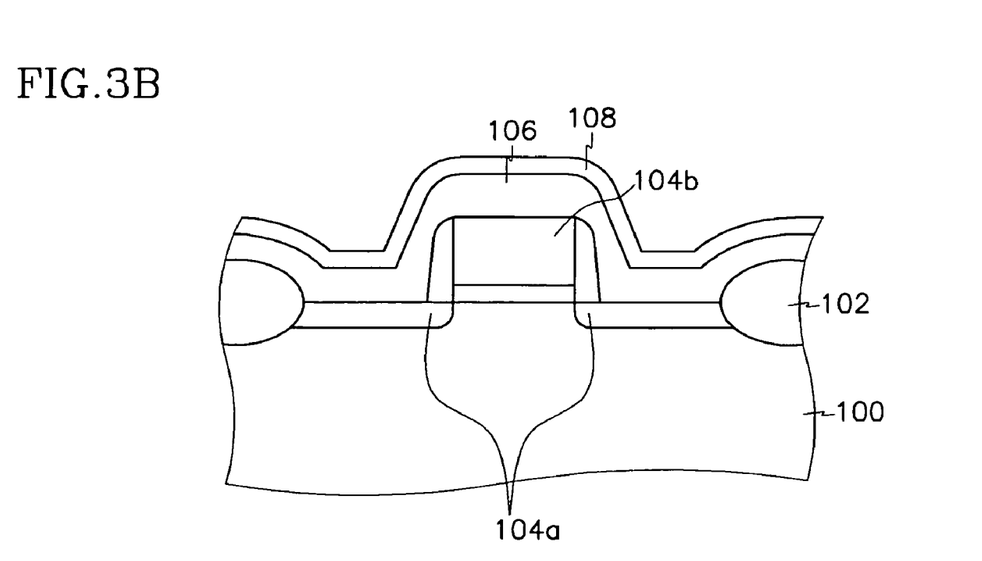

Next, as shown in FIG. 3B, a metal film 106 is formed by sputtering metal, such as cobalt for forming silicide in a sputter chamber in a sputter system, on the entire surface of the semiconductor substrate 100. At this time, the semiconductor substrate 100 is heated at a temperature of 20-50° C. After forming the metal film 106, a Ti or TiN protection film 108 for preventing nitrification or contamination of the metal film 106 in the course of a post-heat treatment process is deposited.

Figure 3C:
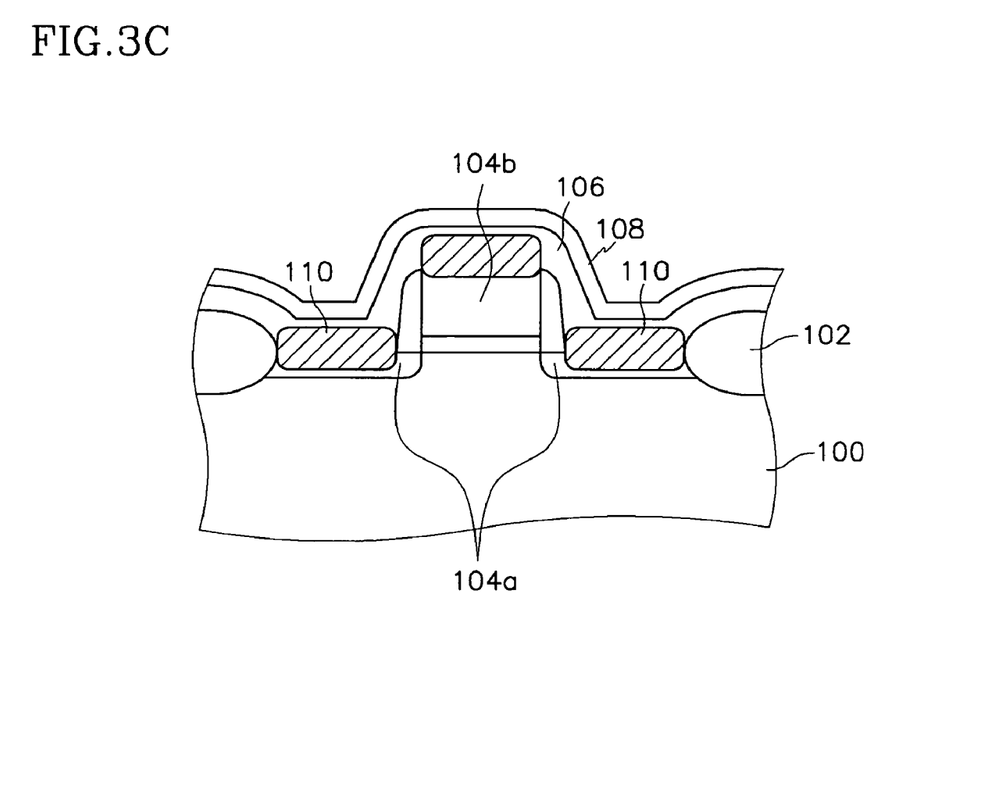
Figure 3D:
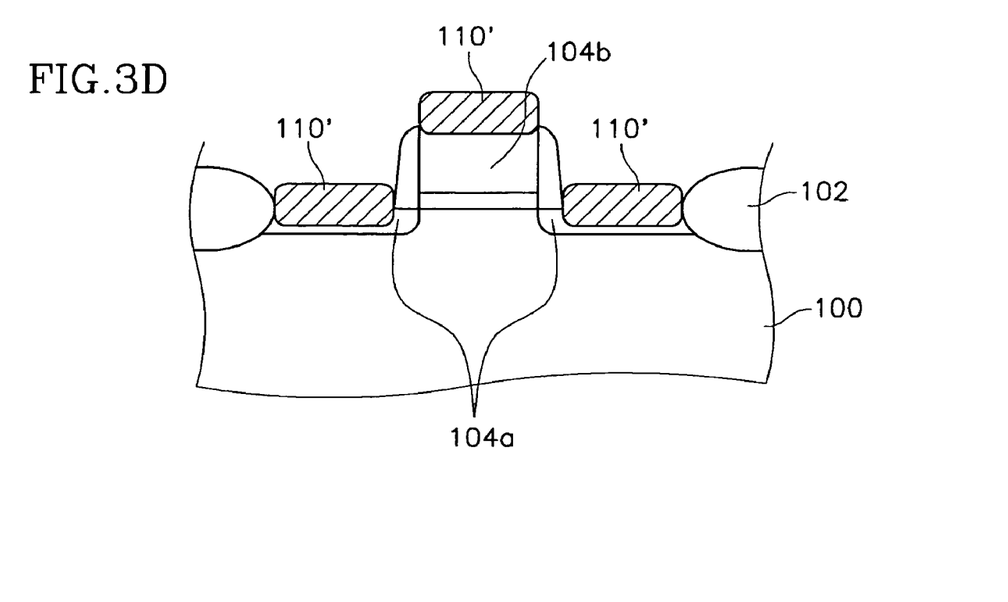

Next, as shown in FIGS. 3C and 3D, silicide 110 is formed by picking and placing the semiconductor substrate 100 into a RTP (rapid thermal process) equipment or an electric furnace and then post-heat treating it at a temperature of 400-600° C. Subsequently, after removing residual metal film 106 not used for the formation of the silicide 100, silicide 110 with a low resistance is completed by annealing the semiconductor substrate 100 and stabilizing a phase of the silicide 100.

However, in the prior art as described above, since the silicide 110 is formed through the post-heat treatment process, and the protection film 108 for protecting a surface of the metal film 106 at the time of the formation of the silicide 110 has to be formed, there is a problem of increase of process time.

SUMMARY OF THE INVENTION

In considerations of the above problem, it is an object of the present invention to provide a method of manufacturing silicide by which silicide is formed at the same time of depositing a metal film.

It is another object of the present invention to provide a semiconductor device with the silicide manufactured by the method of the present invention.

To achieve the objects, according to an aspect of the present invention, a method of manufacturing silicide comprises the steps of:

(a) cleaning a semiconductor substrate with a transistor formed thereon, the transistor including a source electrode, a drain electrode and a gate electrode;

(b) placing the cleaned semiconductor substrate into a sputter chamber in a deposition equipment, and forming silicide at the same time of depositing a metal film under a state where the semiconductor substrate is heated at a temperature of 450-600° C.;

(c) removing residual metal film not used for the formation of silicide; and (d) annealing the semiconductor substrate.

Preferably, in the step (b), silicide with a composition ratio of CoSi is formed, and the step (a) includes a first cleaning step of cleaning the semiconductor substrate using SC1 solution, a second cleaning step of cleaning the semiconductor substrate using HF or DHF solution, and a third cleaning step of plasma-etching the semiconductor substrate in the sputter chamber.

Preferably, the third cleaning step using the plasma-etching includes a first etching step using RF power of 60-90 W and a second etching step of RF power of 250-350 W, and uses argon gas of 3-8 sccm.

Preferably, in the step (b), the metal film is formed by using a cobalt sputter with DC power of 2-10 kW, argon gas of 40-70 sccm is used as gas for a sputtering process, and argon gas of 8-15 sccm is used as gas for heating the semiconductor.

Preferably, the step (c) includes a first removal step of removing the metal film during 5-15 minutes in SPM solution at a temperature of 50-150° C. and a second removal step of removing the metal film during 3-10 minutes in SC1 solution at a temperature of 40-70° C., and the step (d) includes heating the semiconductor substrate during 10-60 seconds at a temperature of 700-950° C. in a RTP equipment or heating the semiconductor substrate during 20-60 minutes at a temperature of 500-900° C. in an electric furnace.

According to another aspect of the present invention, a semiconductor device with the silicide manufactured by the method of the present invention comprises:

a semiconductor substrate including device isolation regions;

transistors provided in respective device regions of the semiconductor substrate, each of the transistors including a gate electrode, a source electrode and a drain electrode;

a PMD (pre-metal dielectric) provided on the semiconductor substrate, the PMD including contact holes to expose a portion of regions of the gate, source and drain electrodes;

contacts provided within the contact holes;

metal wire layers provided on the PMD and connected to the contacts; and silicide with a composition of $CoSi_2$ provided in the transistors so that contact resistances of the contacts are reduced.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENT

A preferred embodiment of the present invention will now be described in detail with reference to the accompanying drawings.

Figure 1:
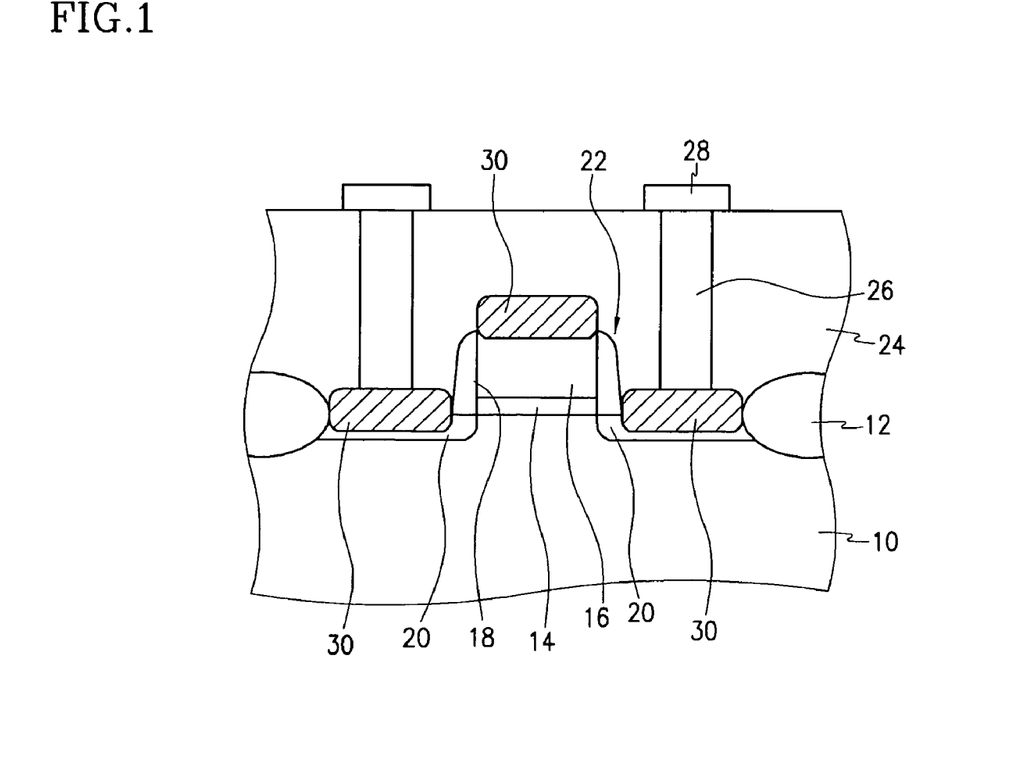
FIG. 1 is a schematic view showing a structure of a semiconductor device according to the present invention.

FIG. 1 is a schematic view showing a structure of a semiconductor device according to the present invention.

As can be seen from FIG. 1, in a semiconductor device of the present invention, a trench (not shown) is formed in a device isolation region of a semiconductor substrate 10, and an insulation oxide film 12 for isolating devices is formed in the trench. A gate oxide film 14 and a gate poly 16 are formed in a device region of the semiconductor substrate 10 and a spacer 18 consisting of an insulation film is formed at side walls of both of the gate oxide film 14 and the gate poly 16. In addition, a source/drain electrode 20 in which impurities with high concentration and with conductivity opposite to that of semiconductor substrate 10 are buried is formed in the semiconductor substrate 10 below the gate oxide film 14.

In addition, A PMD (pre-metal dielectric) 24 having contact holes (not shown) to expose a portion of regions of the gate poly 16 and the source/drain electrodes 20 is formed on the semiconductor substrate 10 where a MOS transistor 22 including the gate oxide 14, the gate poloy 16 and the source/drain electrodes 20. Contacts 26 are formed within the contact holes of the PMD 24, and a metal wire layer 28 connected to the contacts 26 is formed on the PMD 24.

In addition, silicide 30 with a composition of $CoSi_2$ to reduce a contact resistance is formed on the gate poly 16 to contact with the contacts 26 and on the source/drain electrode 20.

Hereinafter, a method of manufacturing the silicide 30 is will be described as below with reference to FIG. 2.

Figure 2A:
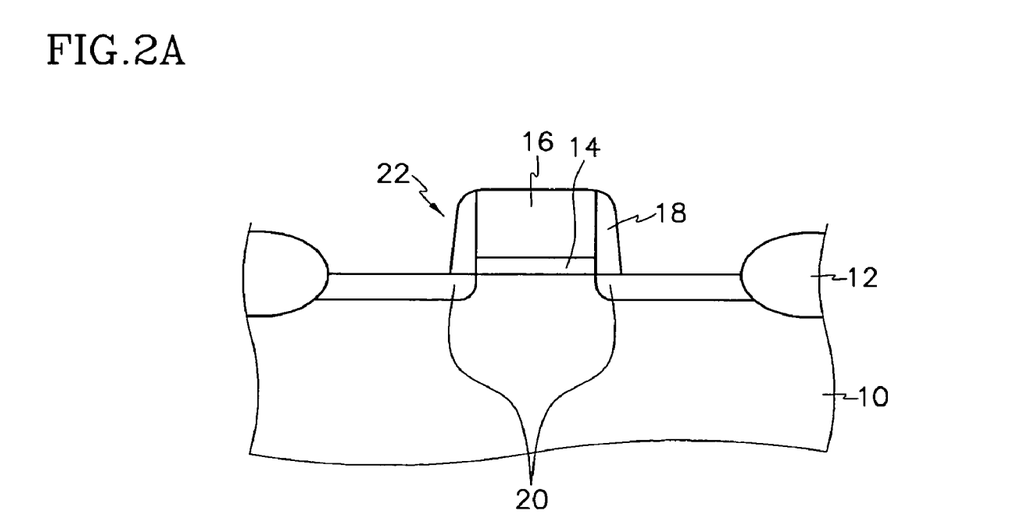
FIGS. 2A to 2G are views showing a process for manufacturing silicide according to the present invention.

First, as shown in FIG. 2A, the transistor 22 including the source/drain electrode 20 and the gate electrode 14 and 16 is formed on the semiconductor 10 and then a cleaning process for removing a variety of undesired impurities such as metal impurities, organic contaminations or natural oxide films residual on the semiconductor substrate 10 is performed.

Figure 2B:
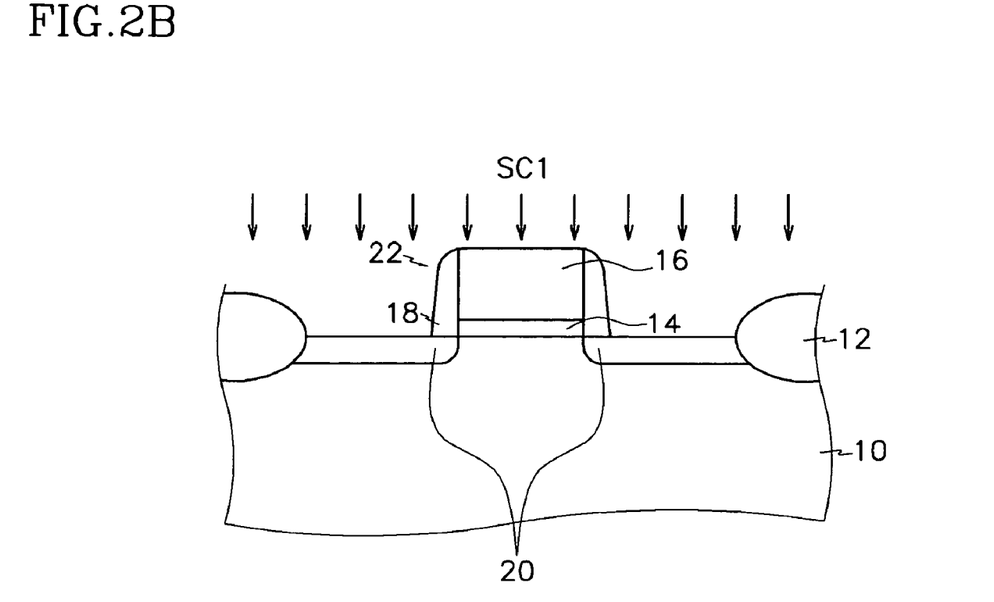
Figure 2C:
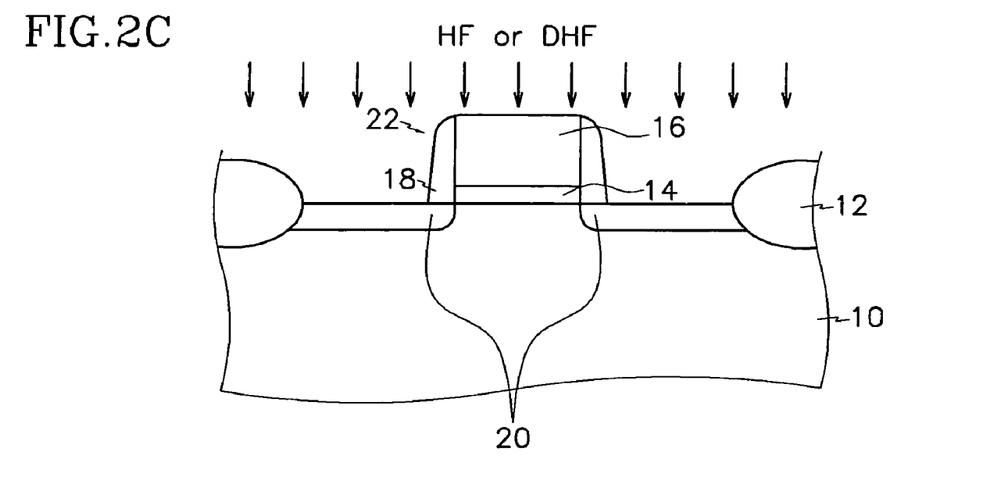
Figure 2D:
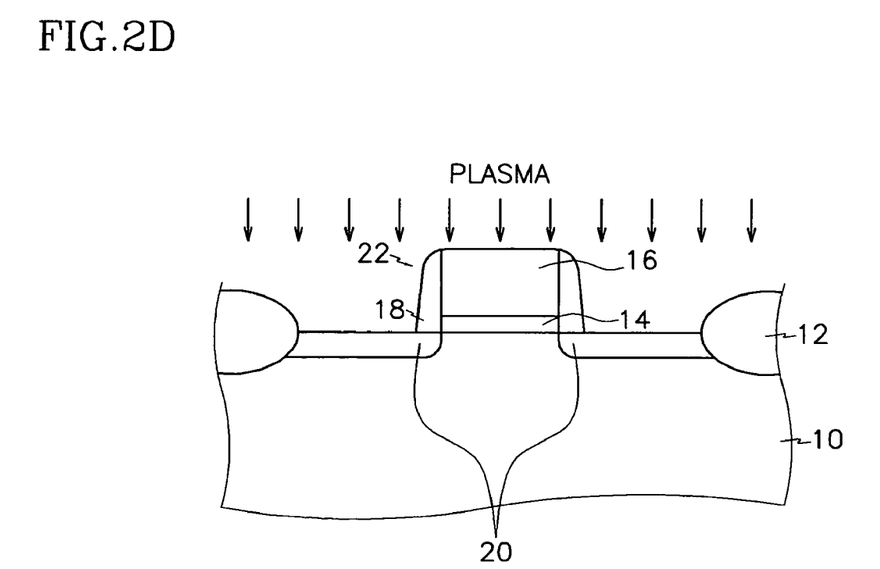

In this embodiment, the cleaning process includes a first cleaning step of cleaning the semiconductor substrate 10 using SC1 (standard cleaning: an organic mixture where $NH_4OH:H_2O_2:H_2O$ is 1:4:20) solution, as shown in FIG. 2B, a second cleaning step of cleaning the semiconductor substrate 10 using HF or DHF (dilute HF) solution, as shown in FIG. 2C, and a third cleaning step of plasma-etching the semiconductor substrate 10, as shown in FIG. 2D. However, these steps are merely exemplified, not requisite for the present invention.

At this time, the third cleaning step as shown in FIG. 2D is performed in a sputter chamber (not shown) of a sputter system for metal film deposition, and argon gas of 3-8 sccm is used as a source of plasma.

In addition, the plasma-etching is preferable to include a first etching step using RF power of 60-90 W and a second etching step of RF power of 250-350 W.

Figure 2E:
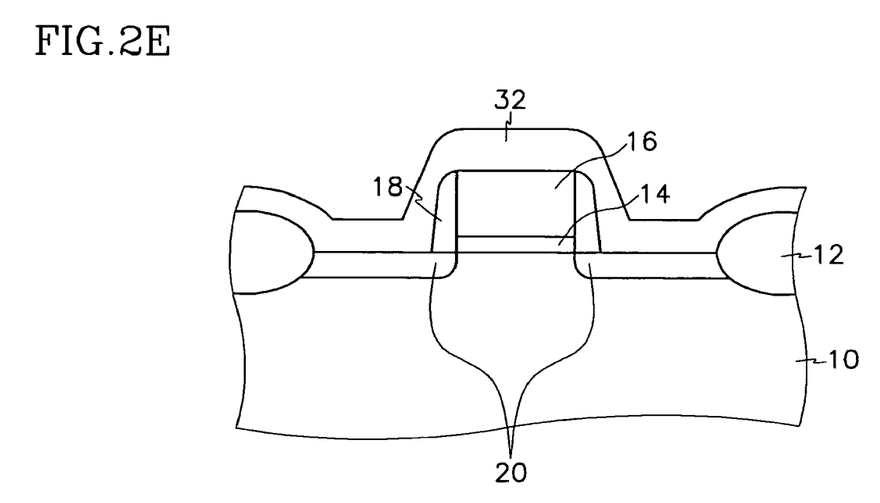

Subsequently, as shown in FIG. 2E, a metal film 32 is formed by sputtering metal, such as cobalt and titanium for forming silicide in the sputter chamber, on an entire surface of the semiconductor substrate 10. Hereinafter, the metal film 32 consisting of a cobalt film will be described as an example.

Then, the semiconductor substrate 10 is heated at a temperature of 450-600° C. using a heater block (not shown) or a convection current by argon gas. In the case of the convection current, argon gas of 8-15 sccm can be used as gas for heating the semiconductor 10.

Figure 2F:
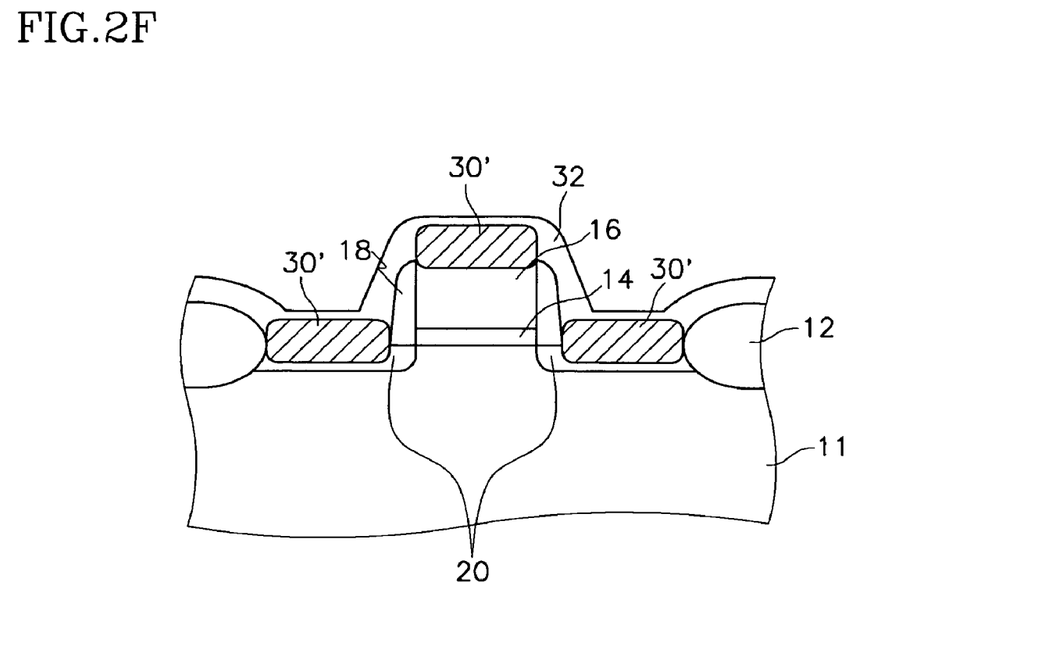

Next, under a state where the semiconductor substrate 10 is heated at the temperature of 450-600° C., the cobalt film 32 is deposited by a sputtering method. At this time, when sputtered cobalt atoms reach the substrate 10, thermal energy by the temperature of the substrate 10 is transferred to the sputtered cobalt atoms. Silicide 30, with a composition of CoSi, is formed at a surface at which the sputtered cobalt atomics collide with silicon, as shown in FIG. 2F. At this time, it should be understood that the cobalt film deposited on the insulation oxide film 12 or the spacer 18 is not silicified even when thermal energy is transferred to the cobalt film 32. That is, self aligned silicide is formed at the same time of depositing the cobalt film 32.

However, if the temperature of the substrate 10 is high, a barrier to impede the formation of the cobalt silicide 30' is formed on the silicon surface due to transfer of thermal energy, and silicification is not effectively achieved.

To avoid this, when cobalt is sputtered, the cobalt film 32 is formed by using a cobalt sputter with high power, preferably, a DC power of 2-10kW, and a gas for a low pressure process, e.g., argon gas of 40-70 sccm. The cobalt atoms sputtered from the cobalt sputter with high power can penetrate the barrier formed by thermal energy so that the silicide 30' can be formed.

Figure 2G:
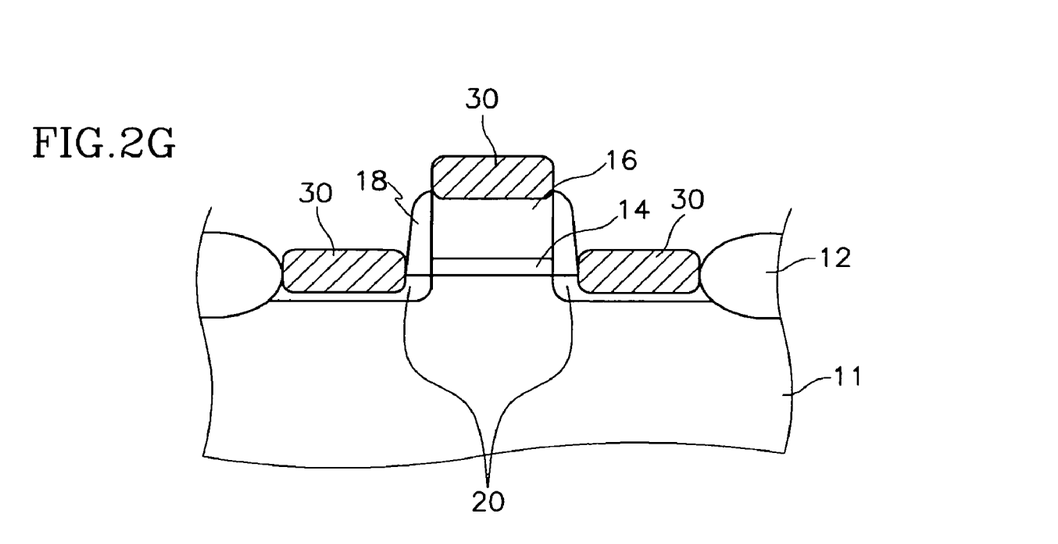

Next, as shown in FIG. 2G, after removing residual metal film 32 not used for the formation of the silicide 30', the silicide 30 with a composition of $CoSi_2$ having a low resistance is completed by annealing the semiconductor substrate 10 and stabilizing a phase of the silicide 30'. Here, the cobalt film 32 can be removed by a first removal step of removing the metal film during 5-15 minutes in SPM solution at a temperature of 50-150° C. and a second removal step of removing the metal film during 3-10 minutes in SC1 solution at a temperature of 40-70° C.

Here, the annealing can be achieved by heating the semiconductor substrate 10 during 10-60 seconds at a temperature of 700-950° C. in a RTP equipment or heating the semiconductor substrate 10 during 20-60 minutes at a temperature of 500-900° C. in an electric furnace.

As apparent from the above description, according to the present invention, since silicide is formed at the same time of depositing a cobalt film, there is an advantage of omission of a protection film formation process over the prior arts where silicide is formed by a post-heat treatment.

Although a preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of manufacturing silicide, comprising the steps of:
   (a) cleaning a semiconductor substrate with a transistor formed thereon, the transistor including a source electrode, a drain electrode and a gate electrode;
   (b) placing the cleaned semiconductor substrate into a sputter chamber in a deposition equipment, and heating the semiconductor substrate to a temperature of from greater than 450 to 600° C.;
   (c) initially forming a monosilicide at the same time as sputtering a metal film at a DC power of 2-10 KW under a state where the semiconductor substrate is heated at the temperature of from greater than 450 to 600° C.;
   (d) removing residual metal film not used for the formation of silicide; and
   (e) annealing the semiconductor substrate.

2. The method of claim 1, wherein, in the step (c), the monosilicide comprises CoSi.

3. The method of claim 2, wherein the step (a) includes a first cleaning step comprising cleaning the semiconductor substrate with SC1 solution.

4. The method of claim 3, wherein the step (a) further includes a second cleaning step comprising cleaning the semiconductor substrate with HF or DHF (dilute HF) solution.

5. The method of claim 1, wherein the step (a) includes plasma cleaning the semiconductor substrate in the sputter chamber.

6. The method of claim 5, wherein the cleaning step includes a first etching step at an RF power 60-90 W and a second etching stop at an RF power of 250-350 W.

7. The method of claim 5, wherein said plasma comprises argon gas of 3-8 sccm.

8. The method of claim 1, wherein the step (c) comprises sputtering cobalt.

9. The method of claim 1, wherein the step (c) comprises sputtering the metal film using argon gas of 40-70 sccm, and heating the semiconductor substrate using argon gas of 8-15 sccm.

10. The method of claim 2, wherein the step (d) includes a first removal step comprising removing the metal film for 5-15 minutes in SPM solution at a temperature of 50-150° C. and a second removal step comprising removing the metal film for 3-10 minutes in SC1 solution at a temperature of 40-70° C.

11. The method of claim 2, wherein the step (c) includes heating the semiconductor substrate for 10-60 seconds at a temperature of 700-950° C. in a RTP equipment.

12. The method of claim 2, wherein the step (c) includes heating the semiconductor substrate for 20-60 minutes at a temperature of 500-900° C. in an electric furnace.

13. The method of claim 2, wherein, after the step (e) the silicide comprises $CoSi_2$.

14. A method of manufacturing silicide, comprising the steps of:
   (a) cleaning a semiconductor substrate with a transistor thereon, the transistor including a source electrode, a drain electrode and a gate electrode;
   (b) placing the cleaned semiconductor substrate into a sputter chamber and spattering a metal film at a DC power of 2-10 kW, while heating the semiconductor substrate at a temperature of 450 to 600° C. to form a silicide having 1:1 metal:silicon ratio;
   (c) removing residual metal film; and
   (d) annealing the semiconductor substrate.

15. The method of claim 14, wherein the silicide comprises CoSi.

16. The method of claim 14, wherein step (b) comprises sputtering the metal film using argon gas of 40-70 sccm, and heating the semiconductor substrate using argon gas of 8-15 sccm.

17. The method of claim 14, wherein the step (c) includes a first removal step comprising removing the metal film for 5-15 minutes in SPM solution at a temperature of 50-150° C. and a second removal step comprising removing the metal film for 3-10 minutes in SC1 solution at a temperature of 40-70° C.

18. The method of claim 15, wherein the step (d) includes rapid thermal processing the semiconductor substrate for 10-60 seconds at a temperature of 700-950° C.

19. The method of claim 15, wherein the step (d) includes heating the semiconductor substrate for 20-60 minutes at a temperature of 500-900° C. in an electric furnace.

20. The method of claim 15, wherein after the step (d) the silicide comprises $CoSi_2$.

* * * * *